United States Patent [19]

Takahashi

[11] Patent Number: 4,609,291

[45] Date of Patent: Sep. 2, 1986

[54] PHOTOELECTRIC ELEMENT CHARACTERISTIC MEASURING APPARATUS

[75] Inventor: Toshiaki Takahashi, Tachikawa, Japan

[73] Assignee: Canon Kabushiki Kaisha, Tokyo, Japan

[21] Appl. No.: 589,545

[22] Filed: Mar. 14, 1984

[30] Foreign Application Priority Data

Mar. 14, 1983 [JP] Japan ................................. 58-42001
Aug. 30, 1983 [JP] Japan ............................... 58-157101

[51] Int. Cl.[4] .............................................. G01J 3/51
[52] U.S. Cl. ................................ 356/418; 324/158 R
[58] Field of Search ............... 136/290; 324/158 D, 324/158 R; 350/316, 318; 356/416, 418, 419; 364/525

[56] References Cited

U.S. PATENT DOCUMENTS

| | | | |
|---|---|---|---|
| 3,463,595 | 8/1969 | Blanc et al. | 356/432 |
| 3,630,627 | 12/1971 | Low et al. | 356/222 |
| 3,782,823 | 1/1974 | Kantorski et al. | 356/318 |
| 4,129,823 | 12/1978 | van der Pool et al. | 324/158 D |
| 4,301,409 | 11/1981 | Miller et al. | 324/158 D |
| 4,459,547 | 7/1984 | Miller | 324/158 R |
| 4,467,438 | 8/1984 | Zerlaut et al. | 356/405 |

Primary Examiner—F. L. Evans
Assistant Examiner—Joel L. Harringa
Attorney, Agent, or Firm—Fitzpatrick, Cella, Harper & Scinto

[57] ABSTRACT

Disclosed is an element characteristic measuring apparatus provided with a first illuminating system for uniformly illuminating the whole area of an element, a second illuminating system for providing an imaging illumination to a part area of the element, and an output detector for detecting the output of the illuminated element.

19 Claims, 14 Drawing Figures

PHOTOELECTRIC ELEMENT CHARACTERISTIC MEASURING APPARATUS

BACKGROUND OF THE INVENTION

1. Field of the Invention

This invention relates to an apparatus capable of suitably setting an optical environment and further a temperature environment suited to effect measurement of the photoelectric conversion characteristics (particularly such as smear, blooming, dark current, spectral sensitivity, sensitivity irregularity and defect of picture element) of an element, for example, an image pickup element such as a charge coupled device (CCD) or other similar element.

2. Description of the Prior Art

In recent years, attention has been paid to solid image pickup elements which can perform functions such as photoelectric conversion, charge accumulation, transfer, detection and processing merely by utilizing the physical properties of a solid. This is because solid image pickup elements have advantages of compactness, light weight and low power consumption as compared with image pickup tubes and moreover, because solid image pickup elements can be manufactured at low cost by mass production and can be readily utilized in various fields by the user. In fact, however, the optical environment characteristic and temperature environment characteristic of the photoelectric conversion characteristics such as smear, blooming, dark current, spectral sensitivity, sensitivity irregularity and defect of picture element are not stable as compared with image pickup tubes.

Therefore, from the viewpoint of quality inspection, it is desirable to measure the photoelectric conversion characteristics of image pickup elements in a predetermined optical environment and further in a predetermined temperature environment, but heretofore it has not been practiced to quantitatively measure the characteristics of the image pickup elements. Nor has it been practiced to partly imaging-illuminate an image pickup element or uniformly illuminate the whole image pickup element and systemwisely measure each characteristic in the same environment.

Particularly, in measuring smear or blooming, a pin hole imaging illumination or a slit imaging illumination having a length 1/10 as great as the length of the picture plane size of the image pick-up element (i.e., a partial illumination) is applied to the image pick-up element. The partial illumination has a quantity of light of each wavelength about 200 times as great as the saturation light quantity of the image pick-up element. During the parital illumination, carriers are generated in the portion of the substrate other than the light-receiving portion or in the lower portion of the substrate, and the carriers diffuse into the transfer portion of the image pick-up element, to result in a direct electric current. The resulting DC component is measured. On the other hand, in the measurement of spectral sensitivity, for example, a uniform illumination is provided to the whole of the image pickup element to thereby detect the sensitivity for each wavelength.

It is desirable that the part illumination and the whole illumination be quantitatively effected selectively in the same environment, whereas this has heretofore not been practiced. Now, in the measurement of the dark current of the image pickup element, the dark current varies to two times for a temperature rise of about 8° C. and therefore, temperature control is necessary. Further, movement of the image pickup element may cause a flow of weak current which in turn may cause heat generation and may thereby cause a temperature rise, and from this viewpoint as well, temperature control is necessary in the measurement of the image pickup element.

It is known to provide a plurality of filters in the illuminating system and rotate a turret to select a desired filter from among the plurality of filters in order to vary the wavelength or the quantity of the illuminating light. That is, as shown in FIG. 1 of the accompanying drawings, a filter turret 2 having a plurality of different filters 1 is secured coaxially with a ratchet wheel 4 and the operator manually rotates the turret while visually confirming the setting on a scale 3 provided on the side surface or the like of the turret 2, and selects a desired filter 1 and interposes it between a light source 6 and an element 7. In this case, positioning and fixing of the selected filter 1 is accomplished by causing the pawl of a spring 5 to be received in a notch of the ratchet wheel 4.

As another example of the prior art, there is a method as shown in FIG. 2 of the accompanying drawings wherein a filter turret 2 is driven by a stepping motor 11 through a connecting gear 10. In this case, positioning of each of filters 1 provided on the turret 2 is accomplished as by providing a projection 8 or the like on the turret 2 and setting the reference position of the motor 11 by a switch 9.

However, in the measurement of the characteristics of the element, the frequency of the selection and positioning of the desired filter is high and the example of the prior art shown in FIG. 1 is inefficient and uneconomical. Also, in the example of the prior art shown in FIG. 2, the positioning accuracy of the filters depends on the accuracy of the stepping motor and, when a positional deviation occurs, the necessary re-adjustment is cumbersome. Further, the stepping motor has a disadvantage that unless a voltage is always applied thereto, the motor cannot fix the positions of the filters. In addition, the number of filters which can be mounted on a turret is limited and this leads to the necessity of interchanging the turret, but it is difficult and cumbersome to adjust the stopped positions of the filters and the motor each time the turret is interchanged.

SUMMARY OF THE INVENTION

It is an object of the present invention to provide an apparatus for uniformly illuminating the whole area of an element or imaging-illuminating a part area of the element and measuring the characteristics of the element.

It is another object of the present invention to provide an apparatus for illuminating an element with the wavelength and the quantity of light being changed and measuring the characteristics of the element.

It is still another object of the present invention to provide an apparatus for isolating an element from the illuminating systems to change the temperature environment of the element and measuring the characteristics of the element.

It is still another object of the present invention to provide an apparatus in which accurate positioning of the turret in the direction of rotation can be accomplished when a predetermined one of a plurality of filters provided on the turret is selected to change the wavelength or the quantity of light and in which the selected filter can be easily discriminated.

BRIEF DESCRIPTION OF THE DRAWINGS

FIGS. 9 to 11A and 11B show various embodiments of the filter turret position control system using a cam and a stopper.

DESCRIPTION OF THE PREFERRED EMBODIMENTS

Figure 1:
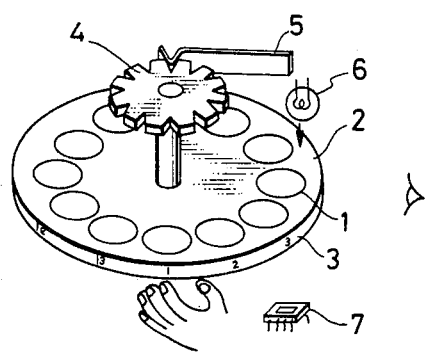
FIGS. 1 and 2 show the above-described filter turret driving systems according to the prior art.
Figure 2:
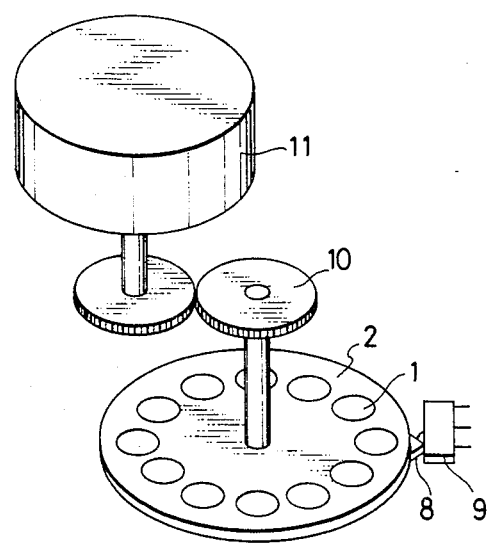
Figure 3A:
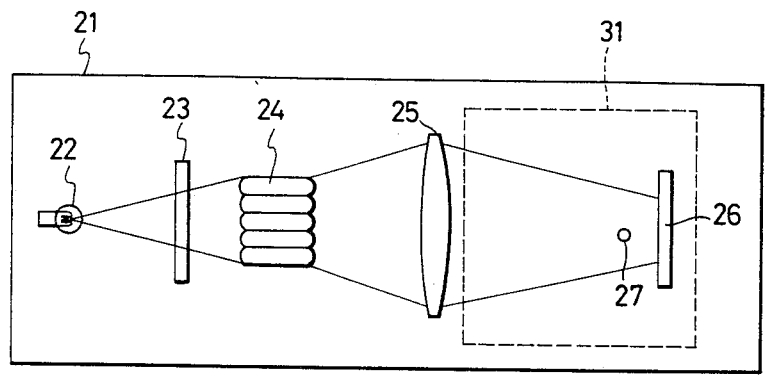
FIGS. 3A and 3B show the whole uniformly illuminating system and the part imaging illuminating system, respectively, according to the present invention.
Figure 3B:
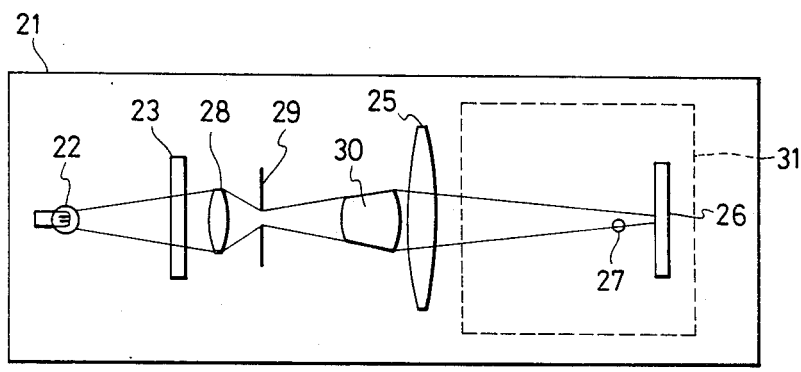

FIGS. 3A and 3B show a whole uniformly illuminating system and a part imaging illuminating system, respectively, according to the present invention.

In FIG. 3A, reference numeral 21 designates a measuring dark chamber, reference numeral 22 denotes a light source for illuminating an image pickup element 26, reference numeral 23 designates a filter for rendering the wavelenght and intensity of the illuminating light into predetermined ones, reference numerals 24 and 25 denote a double-eye lens and a convex lens, respectively, for uniformly illuminating the image pickup element 26 in a wide area, and reference numeral 27 designates a light-receiving element for measuring the quantity of the illuminating light. A light flux emitted from the light source 22 and passed through the filter 23 is made into a plurality of light fluxes by the double-eye lens 24 for uniform illumination, as is known, and is converged by the lens 25 and illuminates the image pickup element 26 overlappingly in a wide area, and uniform illumination is accomplished by the superposition of the light fluxes.

On the other hand, in FIG. 3B, a light flux emitted from the light source 22 and passed through the filter 23 is converged by a condenser lens 28 and illuminates a slit or pin-hole 29. The slit or pin-hole 29 is substantially conjugate with the light-receiving surface of the image pickup element 26 with respect to an imaging lens 30 and the lens 25, and the opening image of the slit or pin-hole is imaged on the light-receiving surface of the image pickup element 26, whereby partial illumination is accomplished. The size of the slit or pin-hole 29 may be varied in accordance with the characteristic to be measured, but in the case of the measurement of the aformentioned blooming, the slit or pin-hole 29 is usually of a size which covers about 1/10 of the length of the light-receiving portion of the entire image pickup element. The lens 25 is used in common for the whole uniform illumination and the part imaging illumination, but in the part imaging illumination, this lens may be eliminated and only the imaging lens 30 provided.

The photoelectrically converted output of the illuminated element is detected by any conventional electrical detector means.

A thermostatic chamber 31 indicated by the dotted line is used when the characteristic of the image pickup element 26 is measured with the temperature conditions changed.

Figure 4:
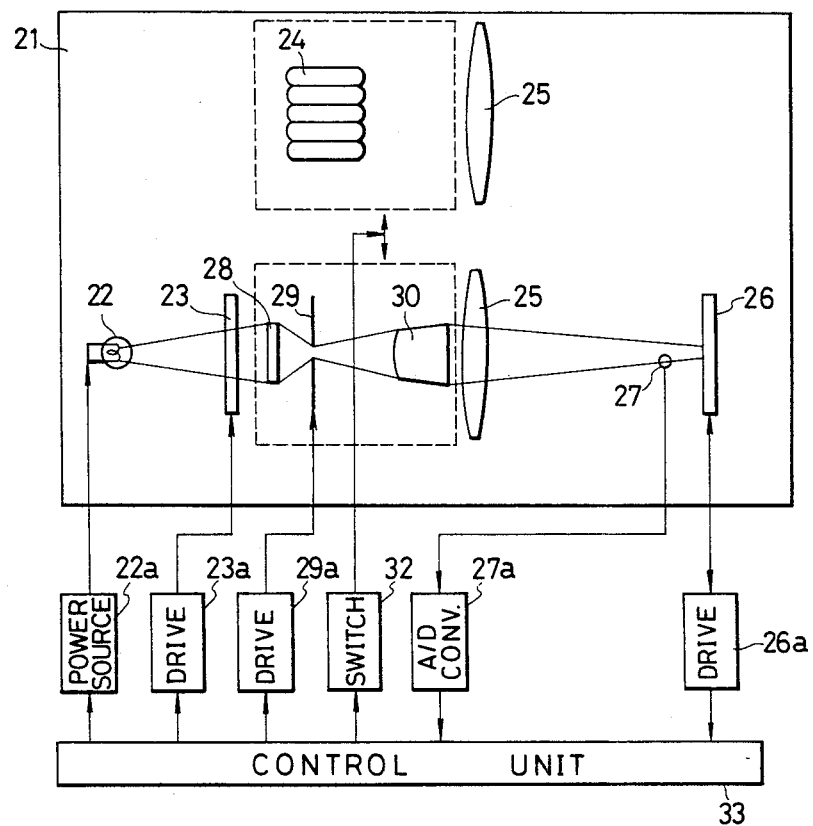
FIG. 4 shows an embodiment in which only a part of an optical system is replaced with another and the illuminating systems are replaced with each other.

FIG. 4 shows an embodiment for changing over the illuminating system for the image pickup element by a control system. The change-over of this illuminating system is effected not by changing over the entire optical system but by changing over a part of the optical system indicated by the broken line. In FIG. 4, reference numerals similar to those in FIGS. 3A and 3B designate similar members. In FIG. 4, reference character 22a designates a power source for the light source, reference character 23a denotes a filter driving device, reference character 26a designates an image pickup element driving device, reference character 27a denotes an A/D converter for digitally converting the output of the light-receiving element 27, reference character 29a designates a slit or pin-hole driving device, reference numeral 32 denotes an illuminating system change-over driving device, and reference numeral 33 designates an automatic control unit. Selection of the whole uniformly illuminating system and the part imaging illuminating system may be automatically accomplished by a time chart of measurement being pre-programmed in accordance with each filter or each slit or pin-hole.

Figure 5:
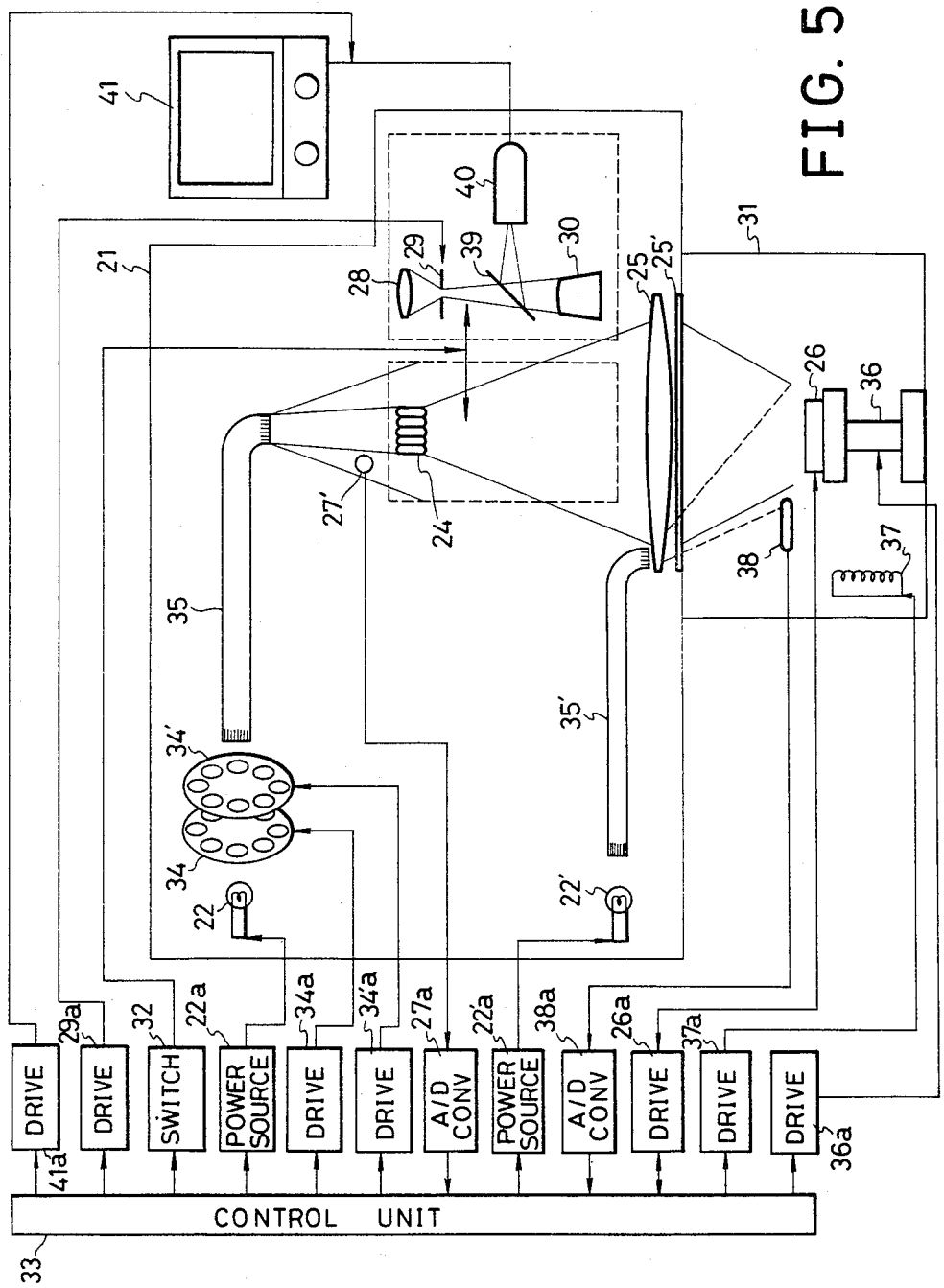
FIG. 5 shows an embodiment in which the temperature environment of an element is variable.

FIG. 5 shows a different embodiment of the present invention which can vary the temperature environment. In FIG. 5, reference numeral 25' designates a heat-resisting light-transmitting plate for separating the environment in which the optical system is placed and the temperature environment, reference numeral 27'denotes a light-receiving element, reference numeral 31 designates a thermostatic tank in which the image pickup element 26 is installed, reference numeral 34 denotes an interference filter for selecting the wavelength of the illuminating light, reference numeral 34' designates an ND filter for selecting the quantity of the illuminating light, reference character 34a denotes an interference filter rotation driving device, reference character 34'a designates an ND filter rotation driving device, and reference numeral 35 denotes a light guiding optical fiber bundle. The light-receiving element 27' for measuring the quantity of light is provided outside the thermostatic tank 31 so as not to be affected by temperature, and selects the ND filter 34' or regulates the voltage of the light source 22 in accordance with the output variation thereof to thereby provide a proper quantity of light at all times. Also, the ND filter 34' is used to make with such a measurement a different quantity of light. The light guiding optical fiber bundle 35 is used to set the light source 22 at any desired position. The light emitted from the light source 22 passes through the selected interference filter 34 and ND filter 34' and is guided by the light guiding optical filter bundle 35, and enters the whole uniformly illuminating system or the part imaging illuminating system with the emergent end thereof being a second light source, and fully or partly illuminates the image pickup element 26 in the thermostatic tank 31 through the lens 25 and the heat-resisting light-transmitting plate 25'.

If a measurment program is incorporated in the automatic control unit 33, automatic measurement at various wavelengths and various quantities of light will be possible. The image pickup element 26 is placed on a sample table 36 provided in the thermostatic tank 31 and is moved by a driving device 36a, whereby measurement of the characteristics such as smear and blooming is effected.

Now, the thermostatic tank 31 is heated or cooled by heating-cooling means 37 and the actual interior temperature thereof is detected by a temperature sensor 38 provided near the image pickup element 26, and the output of the temperature sensor 38 is fed back to the heating-cooling means 37 so that the interior of the thermostatic tank becomes a stable temperature environment. Reference character 37a designates a heating-cooling driving device, and reference character 38a denotes an A/D converter. Reference numeral 22' designates a view field illuminating light source, reference character 22'a denotes the power source thereof, and reference numeral 35' designates a view field illuminating light guiding optical fiber bundle which is used with an observation optical system to be described, for the purpose of illumination for confirming the whole of the image pickup element 26 during non-measurement. That is, when part imaging illumination is to be effected on the image pickup element, it is desirable to preliminarily ascertain what part area of the image pickup element is being illuminated.

Moreover, it is desirable that the image pickup element 26 be in the thermostatic tank 31 so as not to affect the temperature environment of the thermostatic tank 31. An observation optical system having a half-mirror 39, a television camera 40 and a television monitor 41 is provided for such a purpose and is adapted to enable the image pickup element to be automatically observed from on the optic axis when the illuminating system is changed over to the part imaging illuminating system. That is, with the aid of the television monitor 41, the image pickup element 26 is generally observed by the view field illuminating light source 22' during the part imaging illumination and the position partly illuminated by the part imaging illuminating system is observed.

In FIG. 5, reference character 41a designates a television driving device. Due to the presence of the interference filter 34, the view field illuminating light and the measuring light can be distinguished from each other, and in order that these lights may be more easily distinguished from each other, a color filter, not shown, may be provided between the view field illuminating system, for example, the light source 22' and the optical fiber bundle 35'.

During actual measurement (uniform whole illumination or part imaging illumination measurement), the view field illuminating light may be prevented from entering the image pickup element so as not to affect the photoelectric output thereof by turning off the light source 22' or by providing a light-intercepting plate, not shown, in the illuminating optical path.

The lens 25 is used in common during the whole uniform illumination and during the part imaging illumination, and this is because it is difficult to move the lens 25 inasmuch as it needs to have a large diameter for the whole uniform illumination.

As described above, the lens 25 is normally fixed, but it is also possible to make this lens 25 integral with the heat-resisting light-transmitting plate 25' by the use of a heat-resisting material to thereby provide, as it were, the upper lid of the thermostatic tank 31 and in such case, the separate heat-resisting light-transmitting plate 25' may be eliminated.

In the above-described embodiment, the interference filter 34 may be replaced by a spectroscope.

Also, regulation of the quantity of light may be accomplished by regulating the output of the power source 22a of the light source 22 instead of using the ND filter 34'. It is also possible to directly illuminate without using the light guiding optical fiber bundle 35 or to directly view without using the television camera 40 and the television monitor 41. The driving device 32 for changing over the whole uniform illumination and the part imaging illumination may be any driving mechanism.

Figure 6:
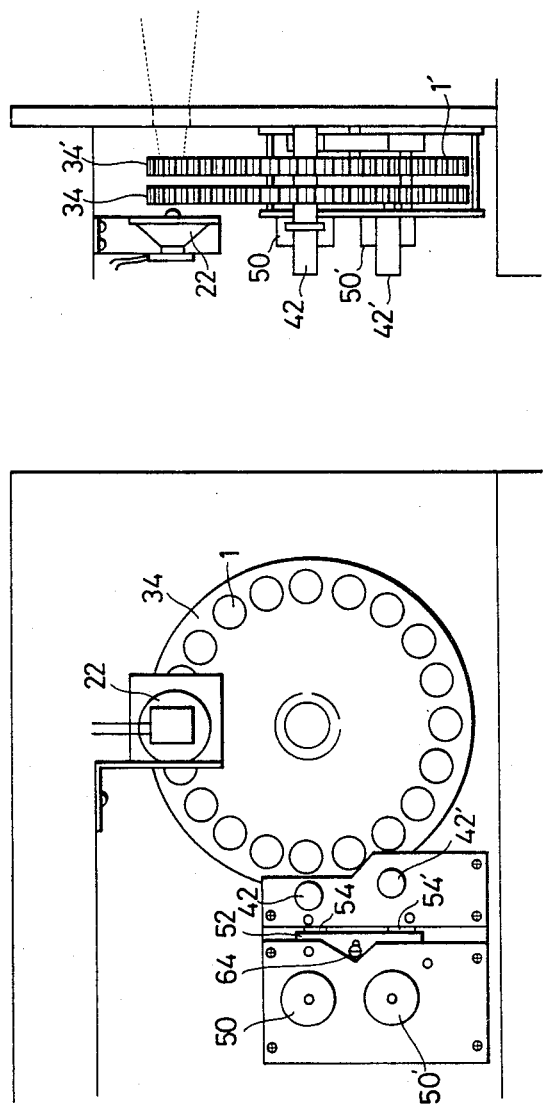
FIGS. 6A and 6B are a front view and a side view, respectively, of the filter turret driving system in the present invention.

Now, FIGS. 6A and 6B are a front view and a side view, respectively, of a filter turret driving system for the filters in the present invention (i.e., the filters for selecting the wavelength, the quantity of light), etc. of the illuminating light.

That is, FIG. 6A is a front view of a device for driving the turret 34 of the interference filter having a plurality of filters 1 secured on a concentric circle and formed with a predetermined number of teeth and the turret 34' of the ND filter having ND filter 1' likewise secured, and FIG. 6B is a side view of the FIG. 6A device. The turrets 34 and 34' are controlled and located at predetermined positions by drive motors 42 and 42', respectively, and the illuminating light source 22 illuminates the image pickup element, not shown, through selected filters 1 and 1', whereby the photoelectric conversion charactetistic of the element is measured.

Figure 7:
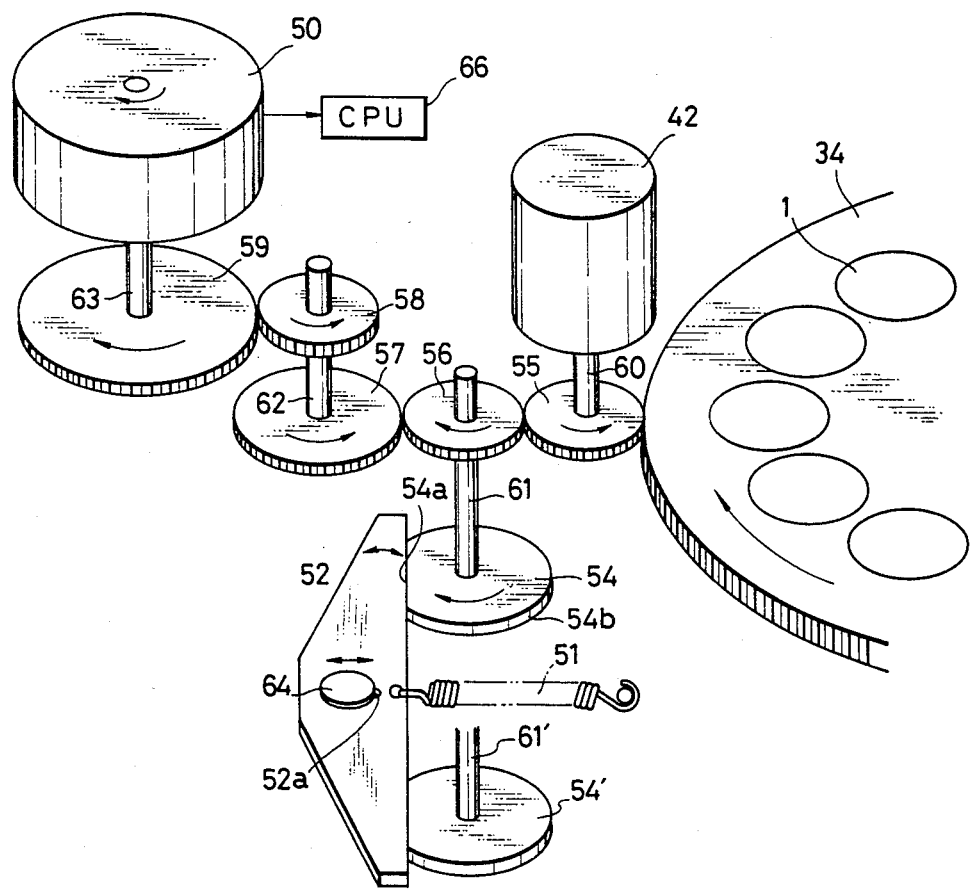
FIGS. 7 and 8 are a schematic perspective view and a gear construction view, respectively, of the filter turret driving system.

FIG. 7 shows the construction of the driving system for the interference filter turret 34 to explain the construction of FIGS. 6A and 6B more specifically. The driving system for the ND filter turret 34' is of a similar construction and therefore, it is not shown except for a cam 54' and a shaft 61'. A gear 55 is fitted on the rotary shaft 60 of the drive motor 42 and this gear 55 is designed to mesh with the teeth of the turret 34 when the turret 34 is mounted on the device. The gear 55 is in mesh engagement with a gear 56 having a cam 54 fixed coaxially with a shaft 61, which gear 56 in turn is in mesh engagement with a gear 57. A gear 58 is fixed to the shaft 62 of the gear 57 and is in mesh engagement with a gear 59 fitted on the shaft 63 of a potentiometer 50.

The cam 54 is of a construction having a planar portion 54a provided by cutting away a disk along a straight line, and a substantially rectangular stopper 52 biased by a spring 51 bears against the planar portion 54a and outer peripheral portion 54b of the cam 54. A slot 52a facing in a direction perpendicular to the lengthwise direction of the stopper 52, namely, in a direction toward the spring 51, is formed in the central portion of the stopper 52, and a shaft 64 is mounted in the slot 52a. Accordingly, the stopper 52 is rotatable about the shaft 64 and slidable along the slot 52a. When the cam 54 is in its position of FIG. 7, that is, when the stopper 52 bears against the planar portion 54a of the cam 54, it means that a selected filter 1 of the turret 34 has been accurately located between the light source 22 and the image pickup element.

Figure 9:
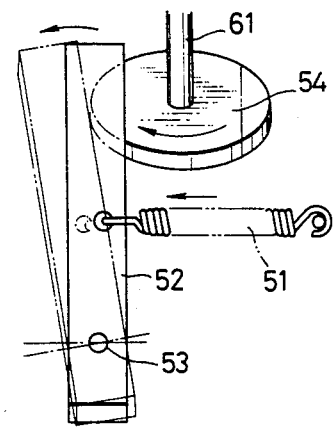

The stopper may be provided for each filter turret driving system (FIG. 9), and the cam 54 may be constructed so as to have two cut-away portions provided by cutting away a disk along parallel straight lines or alternatively, the cam 54 may be formed into a square shape or an equilateral polygonal shape.

Figure 8:
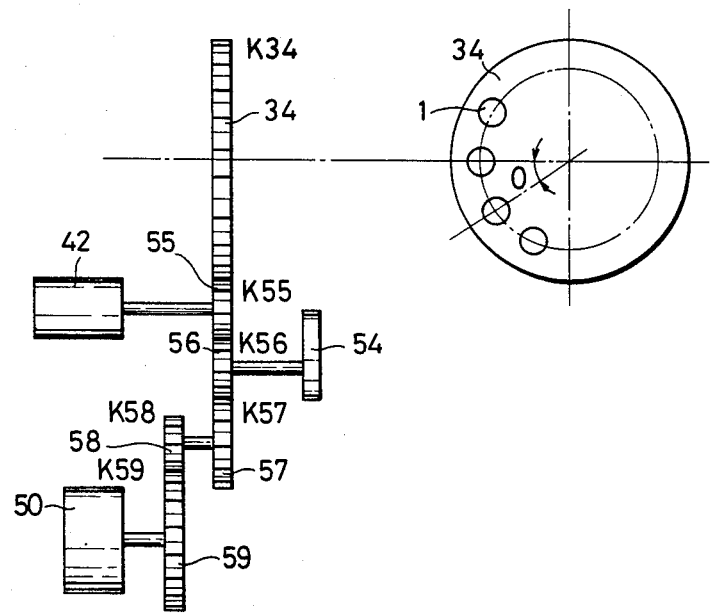

Describing the relation between the abovedescribed members, design is made such that the cam 54 makes one full rotation for each filter 1 of the turret 34 and the gear 59 of the potentiometer 50 makes one full rotation for one full rotation of the turret 34. That is, if, in FIG. 8, the numbers of teeth of the turret 34 and the gears 55, 56, 57, 58 and 59 are K34, K55, K56, K57, K58 and K59, respectively, and the number of filters 1 mounted on the turret 34 is N and the pitch angle of the filters 1 is $\theta$, then there are obtained the following relations:

$$\frac{K55}{K34} = \frac{K55}{K56} \times \frac{K56}{K57} \times \frac{K58}{K59} = \frac{K55 \times K58}{K57 \times K59} \quad (1)$$

$$N = \frac{360}{\theta} = \frac{K34}{K56} \quad (2)$$

From equations (1) and (2), $$\frac{K56}{K34} = \frac{K56}{K57} \times \frac{K58}{K59} = \frac{1}{N} = \frac{\theta}{360} \quad (3)$$

$$\therefore N = \frac{360}{\theta} = \frac{K57 \times K59}{K56 \times K58} = \frac{K34}{K56}$$

That is, if each member is constructed so as to satisfy equation (3), the already described relation can be achieved. Although a cut-away portion is formed in the cam 54, one more cut-away portion may be provided in the opposite circumferential portion of the cam and in this latter case, the turret makes one-pitch-rotation for each ½ of one full rotation of the cam. Further, the angle division of the potentiometer 50 is determined by the number N of filters 1 and therefore, the number of gears is not always limited to five.

One full rotation of the turret 34 corresponds to one full rotation of the gear 59 fixed to the shaft 63 of the potentiometer 50 and therefore, if the position of a filter of the turret 34 in the direction of rotation is determined as the reference, the absolute position information of the turret 34 may be obtained by measuring the resistance value of the potentiometer 50. This resistance value can be used as the address signal of CPU 66 when the image pickup element is to be measured systemwise. Further, even if the turret 34 is replaced with another turret, which filter 1 of the turret 34 during the preceding step has been used can be discriminated by the resistance value of the potentiometer, and this can be used as the position information of the next turret.

The operation of the foregoing embodiment will now be described by the use of the driving system for the interference filter turret 34.

Figure 10:
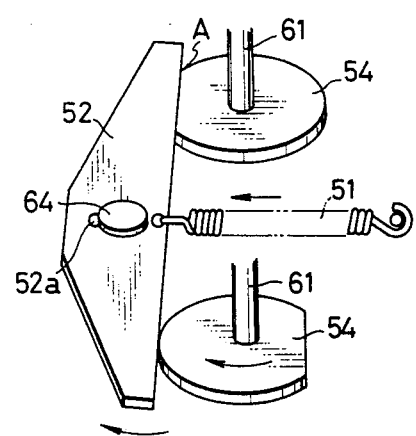

When a current flows to the interference filter turret driving motor 42 to rotate the shaft 60 of the motor, the gear 55 rotates in the same direction as the motor shaft. The gear 55 transmits the rotation to the interference filter turret 34, the gear 56 and the gear 57 at predetermined transmission ratios, respectively. Since the gear 57 and the gear 58 are fixed to the same shaft 62, the rotation transmitted to the gear 57 is transmitted to the gear 58 through the shaft 62 and further to the gear 59. Since the gear 59 is fixed to the shaft 63 of the potentiometer 50 for the interference filter, the shaft 63 of the potentiometer 50 makes the same rotation in the same direction. Also, since the cam 54 for the interference filter and the gear 56 are fixed to the same shaft 61, the rotation transmitted to the gear 56 is transmitted to the cam 54 through the shaft 61 in the same direction. When the cam 54 is rotated, the stopper 52 moves about the rotational shaft 64 along the outer peripheral portion 54b of the cam 54 while pulling the spring 51 as shown in FIG. 10 and, when the cam 54 makes one full rotation, the stopper 52 returns to its position of FIG. 7. Such operation is repeated. Even if more or less error occurs in the control of the motor 42, the cam 54 is set to its normal position (FIG. 7) by the planar portion 54a thereof and the spring 51 and thus, accurate positioning of the filters 1 becomes possible.

Figure 11A:
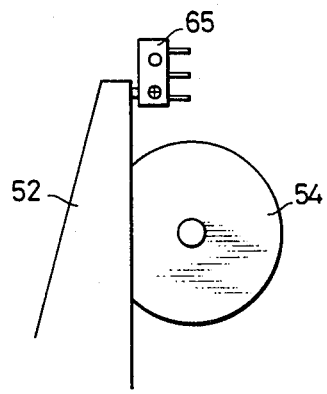
Figure 11B:
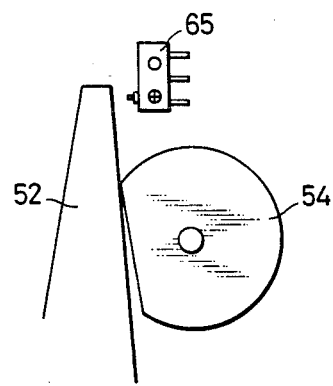

Further, if, as shown in FIGS. 11A and 11B, a sensor 65 such as a microswitch is provided at a place whereat the amount of movement of the stopper 52 is maximum, even if the cam 54 is not in its normal stopped position (FIG. 11A) due to some defect of the spring 51, the cam 54 or other member, the unsatisfactory stopped position (FIG. 11B) can be detected. This detection signal can be used as the start command signal of the measuring apparatus for the image pickup element or the like in which this device is used, or can be used to re-drive the motor 42 to correct the position of the cam 54 to its normal position.

In the above-described embodiment, the member for biasing the stopper member toward the cam member has been described as a spring, but alternatively, it may be a link mechanism or other device.

According to the present invention, as described above, measurement of the spectral sensitivity, the sensitivity irregularity, the element defect, etc. of the image pickup element becomes possible by effecting the whole uniform illumination of any wavelength and of any quantity of light on the image pickup element.

Also, measurement of the smear, the blooming, the resolving power, etc. of the image pickup element is possible by imaging a slit or spot of any wavelength, any quantity of light and any shape on the image pickup element and illuminating the same.

In that case, it is possible to provide the whole uniformly illuminating system and the part imaging illuminating system in the same measuring dark chamber and effect measurement of the two systems simply by moving the image pickup element to two illuminating system positions by a driving system.

Further, if the change-over of the two illuminating systems is effected by replacing a part of the optical system with another, it will be possible to effect measurement of the two systems without moving the image pickup element to a different illuminating system position.

Also, by providing the image pickup element in the thermostatic tank and providing the measuring optical system outside the thermostatic tank, it becomes possible that the image pickup element is not subjected the temperature change by the light source or other and in addition, the image pickup element is placed in any temperature environment. Thus, accurate measurement of the characteristics of the image pickup element sensitive to temperature, such as the dark current characteristic and the like, becomes possible.

Also, the use of the light-guiding optical fiber bundle enables the guided light flux to be readily guided to all directional positions without being mingled with the extraneous light flux. Further, by providing the observation optical system in a part of the part imaging illuminating system together with the view field illuminating system, it becomes possible to observe the entire image pickup element with a slit or pin-hole image by the television monitor without disturbing the temperature environment within the thermostatic tank. Thus, when the position of the slit or pin-hole image formed on the surface of the image pickup element is to be displaced, the displacement can be effected while the position is being observed by means of the television monitor and therefore, accurate positioning becomes possible. Also, the provision of the control unit leads to the possibility of suitably setting the optical environment and the temperature environment, and this in turn leads to the elimination of the trouble of effecting observation at all times, particularly during time-consuming measurements such as temperature control.

Also, according to the present invention, the position of the turret having a plurality of optical filters can be easily detected and at the same time, it is possible to accurately accomplish the positioning of a desired filter. Further, the measurement of an image pickup element, especially a solid image pickup element such as CCD, is often effected together with the time-consuming temperature environment control, and therefore, it is effective for automatic control measurement incorporating a measurement program therein.

The present invention has been described in detail with respect to an image pickup element, whereas the invention is not restricted thereto, but apparently it is applicable, for example, to the wafer in the semiconductor manufacturing process, that is, the IC inspection and measurement in the bonding.

What I claim is:

1. A photoelectric element characteristic measuring apparatus having:
    a first illuminating system comprising a first optical system for uniformly illuminating the whole area of a photoelectric element so as to cause generation of first information concerning photoelectric conversion on the element; and
    a second illuminating system comprising a second optical system for effecting an imaging illumination of a predetermined pattern on a part area of the element so as to cause generation of second information concerning photoelectric conversion on the element;
    said first optical system and said second optical system using a part thereof in common.

2. An element characteristic measuring apparatus according to claim 1, wherein a portion of said optical system of said one illuminating system can be replaced with a portion of said optical system of said other illuminating system.

3. An element characteristic measuring apparatus according to claim 1, wherein said first illuminating system has a double-eye lens and a single lens.

4. An element characteristic measuring apparatus according to claim 1, wherein at least one of said first and second illuminating systems is variable in wavelength with which it illuminates the element.

5. An element characteristic measuring apparatus according to claim 1, wherein at least one of said first and second illuminating systems is variable in the quantity of light with which it illuminates the element.

6. An element characteristic measuring apparatus according to claim 5, wherein said variable quantity of light is detected by a quantity-of-light detector.

7. An element characteristic measuring apparatus according to claim 1, wherein a light source and a light guiding fiber are used in common in said first and second illuminating systems.

8. A photoelectric element characteristic measuring apparatus having:
    a first illuminating system comprising a first optical system for uniformly illuminating the whole area of a photoelectric element so as to cause the generation of first information concerning photoelectric conversion on the element;
    a second illuminating system comprising a second optical system for effecting an imaging illumination of a predetermined pattern on a part area of the element so as to cause the generation of second information concerning photoelectric conversion on the element;
    a view field illuminating system for illuminating the whole area of the element during illumination by said second illuminating system; and
    an observation system for observing the element.

9. An element characteristic measuring apparatus according to claim 8, wherein said observation system and a part of the optical system of said second illuminating system are integral with each other.

10. An element characteristic measuring apparatus according to claim 9, wherein said part of the optical system of said second illuminating system integral with said observation system is replaced with a part of said optical system of said first illuminating system, and said first and second illuminating systems are replaced with each other.

11. An element characteristic measuring apparatus according to claim 8, wherein said second illuminating system and said view field illuminating system differ in wavelength from each other.

12. An element characteristic measuring apparatus according to claim 8, wherein the illumination of the element by said view field illuminating system is stopped before the characteristic of the element is measured by said second illuminating system.

13. A photoelectric element characteristic measuring apparatus having:
    a first illuminating system comprising a first optical system for uniformly illuminating the whole area of a photoelectric element so as to cause generation of first information concerning photoelectric conversion on the element;
    a second illuminating system comprising a second optical system for effecting an imaging illumination of a predetermined pattern on a part area of the element so as to cause generation of second information concerning a photoelectric conversion on the element;
    at least one of said first and second illuminating systems having a filter turret provided with a plurality of filters for varying the wavelength or the quantity of light in the illumination of the element; and
    a driving system for driving said turret, having:
        a cam member formed with at least one cut-away portion in the outer peripheral portion thereof and rotatable in response to the rotation for setting different filters;
        a stopper member bearing against the outer peripheral portion of said cam member; and
        a biasing member for biasing said stopper member toward said cam member.

14. An element characteristic measuring apparatus according to claim 13, wherein said cam member makes one full rotation each time said turret rotates by a predetermined angle to replace the filter of said turret with the adjacent filter.

15. An element characteristic measuring apparatus according to claim 13, wherein there is provided a potentiometer whose shaft is rotatable concomitantly with rotation of said turret and a selected filter of said turret is discriminated by reading the resistance value of said potentiometer.

16. An element characteristic measuring apparatus according to claim 15, wherein said potentiometer makes one full rotation when said turret makes one full rotation.

17. A photoelectric element characteristic measuring apparatus having:
- a first illuminating system comprising a first optical system for uniformly illuminating the whole area of a photoelectric element so as to cause generation of first information concerning photoelectric conversion on the element;
- a second illuminating system comprising a second optical system for effecting an imaging illumination of a predetermined pattern on a part area of the element so as to cause generation of second information concerning photoelectric conversion on the element; and
- a thermostatic tank for setting the element in a predetermined temperature environment.

18. A photoelectric element characteristic measuring apparatus having:
- a first illuminating system comprising a first optical system for uniformly illuminating the whole area of a photoelectric element so as to cause generation of first information concerning photoelectric conversion on the element;
- a second illuminating system comprising a second optical system for effecting an imaging illumination of a predetermined pattern on a part area of the element so as to cause generation of second information concerning photoelectric conversion on the element;
- a view field illuminating system for illuminating the whole area of the element during illumination by said second illuminating system;
- an observation system for observing the element; and
- a thermostatic tank for setting the element in a predetermined temperature environment.

19. A photoelectric element characteristic measuring apparatus having:
- a first illuminating system comprising a first optical system for uniformly illuminating the whole area of the element so as to cause generation of first information concerning photoelectric conversion on the element; and
- a second illuminating system comprising a second optical system for effecting an imaging illumination of a predetermined pattern on a part area of the element so a to cause generation of second information concerning photoelectric conversion on said element,
- at least one of said first and second illuminating systems having a filter turret provided with a plurality of filters for varying the wavelength or the quantity of light for the illumination of the element.

* * * * *

UNITED STATES PATENT AND TRADEMARK OFFICE
CERTIFICATE OF CORRECTION

PATENT NO. : 4,609,291
DATED : September 2, 1986
INVENTOR(S) : TOSHIAKI TAKAHASHI It is certified that error appears in the above-identified patent and that said Letters Patent is hereby corrected as shown below:

Column 1, line 53, change "parital" to --partial--.
Column 4, line 53, delete "with" after "make" and insert --with-- after "measurement--.
Column 6, line 16, change "light)," to --light,--;
          line 17, change "light." to --light).--.
Column 7, line 1, change "abovedescribed" to --above-described--.
Column 8, line 52, change "the" (second occurrence) to --to--.
Column 10, line 47, delete "a" before "photoelectric".
Column 12, line 23, change "a" to --as--.

Signed and Sealed this

Seventeenth Day of February, 1987

Attest:

DONALD J. QUIGG

*Attesting Officer*     *Commissioner of Patents and Trademarks*